United States Patent [19]
Abe

[11] Patent Number: 5,989,048
[45] Date of Patent: *Nov. 23, 1999

[54] IC POSITIONING DEVICE IN IC SOCKET

[75] Inventor: Shunji Abe, Yokohama, Japan

[73] Assignee: Yamaichi Electronics Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/771,416

[22] Filed: Dec. 20, 1996

[30] Foreign Application Priority Data

Dec. 21, 1995 [JP] Japan ................................ 7-349847

[51] Int. Cl.$^6$ ................................................ H01R 11/22
[52] U.S. Cl. ............................................... 439/266; 439/72
[58] Field of Search ................................ 439/266–270, 439/70–73

[56] References Cited

U.S. PATENT DOCUMENTS

| 5,205,756 | 4/1993 | Myers | 439/266 |
| 5,387,118 | 2/1995 | Kishi etal. | 439/266 |
| 5,447,444 | 9/1995 | Matsuoka | 439/266 |
| 5,490,795 | 2/1996 | Hetzel et al. | 439/266 |
| 5,626,481 | 5/1997 | Abe | 439/266 |

*Primary Examiner*—Hien Vu
*Attorney, Agent, or Firm*—Wenderoth, Lind & Ponack, L.L.P.

[57] ABSTRACT

A device is provided for positioning an IC having a plurality of leads arranged in array along side surfaces of an IC body. The IC positioning device in an IC socket comprises a locator for pressing an outer side surface of a lead located on an extreme arraying end of the lead array group. The locator is moved while pressing side surfaces of leads which are displaced in an array direction, so that the lead array group and the IC body are moved to predetermined positions.

23 Claims, 9 Drawing Sheets

IC POSITIONING DEVICE IN IC SOCKET

BACKGROUND OF THE INVENTION

1. Field of the Invention

This invention relates to an IC positioning device capable of shifting the leads of an IC loaded in a socket to a correct location suitable for physical contact.

2. Brief Description of the Prior Art

An IC shown in FIG. 1 has leads arranged in array along the side surfaces of an IC body 1 and projecting outwardly therefrom.

FIG. 2 shows a socket having a plurality of contacts 3 which can contact the IC placed in the socket. The socket has an IC receiving portion 5 formed in a center portion on an upper surface of a socket body 4. The contacts 3 are arranged in array along the opposite two or four sides of the IC receiving portion 5.

A cover 6, which is movable upwardly and downwardly, overlies an upper part of the socket body 4. When the cover 6 is lowered, the contacts 3 are caused to be displaced backwardly against their resiliency to move the contacts out of physical contact with the IC leads 2. When the contacts 3 are displaced forwardly by their own restoring force, the contacts 3 are brought into contact with the upper surfaces of the IC leads 2 under pressure.

As means for transforming the lowering motion of the cover 6 to the displacing motion of the contacts 3, there is employed a turnable lever 7 capable of contacting the contacts 3. Instead of providing the turnable lever 7, the contacts 3 may be displaced backwardly by a lowering force of the cover 6 acting on pressure receiving portions which are integral with the contacts 3, respectively.

As best shown in FIGS. 3 and 4, in the above exemplified socket, the lower surfaces of the leads 2 are supported on a seat surface 8, and outer side surfaces of the leads on the extreme ends 2a of each array group of leads 2 are restricted by positioning walls 9 which project from opposite ends of the seat surface 8, so that the leads 2 are all correctly positioned.

However, recently, the arrangement pitches of the IC leads 2 were reduced to 0.3 mm or 0.4 mm, and with the progress of this tendency, the width of each lead was also miniaturized.

In this way, in case the IC leads are arranged at very small pitches and miniaturized, it is very difficult to correctly position the contacts with respect to the IC leads by use of the positioning walls 9 which are fixedly arranged in place as shown in FIGS. 3 and 4. As a consequence, the centers of the IC leads and the contacts 3 are overly displaced as shown in FIGS. 3 and 4. This problem is aggravated by manufacturing tolerances of the positioning walls 9 and the leads 2.

The present invention has been accomplished in order to obviate the above problem.

SUMMARY OF THE INVENTION

It is, therefore, an object of the present invention to provide an IC positioning device in an IC socket, in which IC leads arranged at very small pitches in array from the sides of an IC body and projecting sideways therefrom, are correctly positioned in a socket body when an IC is placed in the socket body.

In order to achieve the above object, there is essentially provided a device for positioning an IC having a plurality of leads arranged in array along side surfaces of an IC body, the IC positioning device in an IC socket comprising a locator for pressing an outer side surface of a lead located on an extreme arraying end of the lead array group. The locator being moved while pressing side surfaces of leads which are displaced in an array direction, so that the lead array group and the IC body are moved to predetermined positions.

It is preferred that a pair of the locators are arranged in opposing relation so that the locators can press outer surfaces of leads which are located on extreme arraying ends of the lead array group.

The locator preferably resiliently presses the side surface of the lead in a pressing direction via a spring.

The lead pressing portion of the locator preferably has a resilient property so that the locator can resiliently press the side surface of the lead.

The above and other objects, characteristic features and advantages of the present invention will become more apparent to those skilled in the art by the following description of the preferred embodiment of the invention, as illustrated in the accompanying drawings.

BRIEF DESCRIPTION OF THE DRAWINGS

FIG. 12 is a sectional view of the socket, showing the positioning device, in which the press lever serving as a locator is formed of a member having its own resiliency such as a leaf spring or the like.

DETAILED DESCRIPTION OF THE EMBODIMENT

One embodiment of an IC positioning device in an IC socket according to the present invention will now be described with reference to the accompanying drawings.

Figure 1:
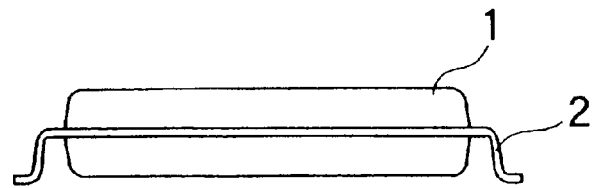
FIG. 1 is a side view showing a conventional gull-wing type IC.
Figure 2:
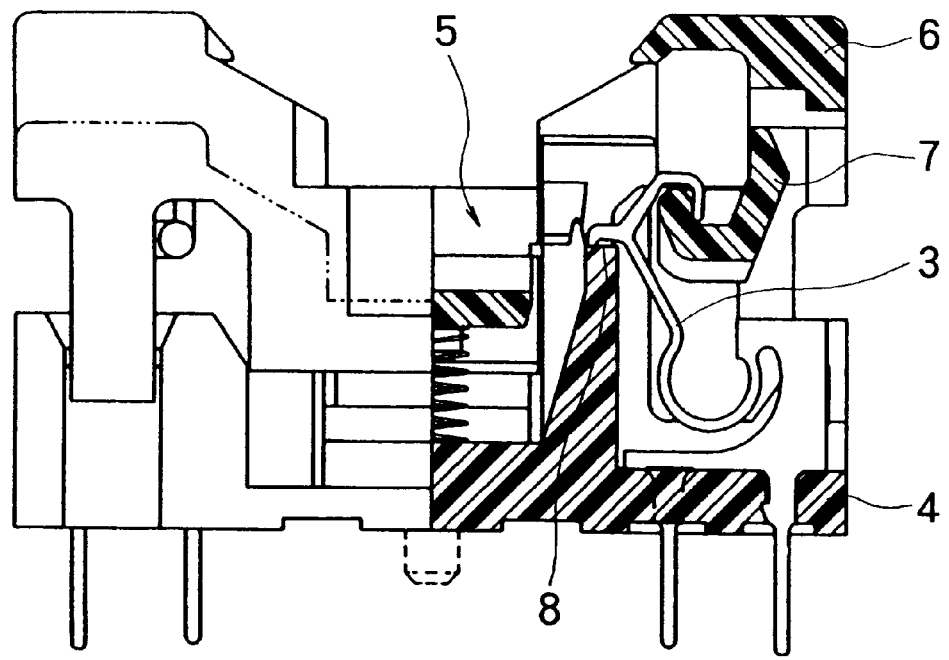
FIG. 2 is a side view, partly in section, showing one example of a socket in which a conventional IC positioning device is used.
Figure 3:
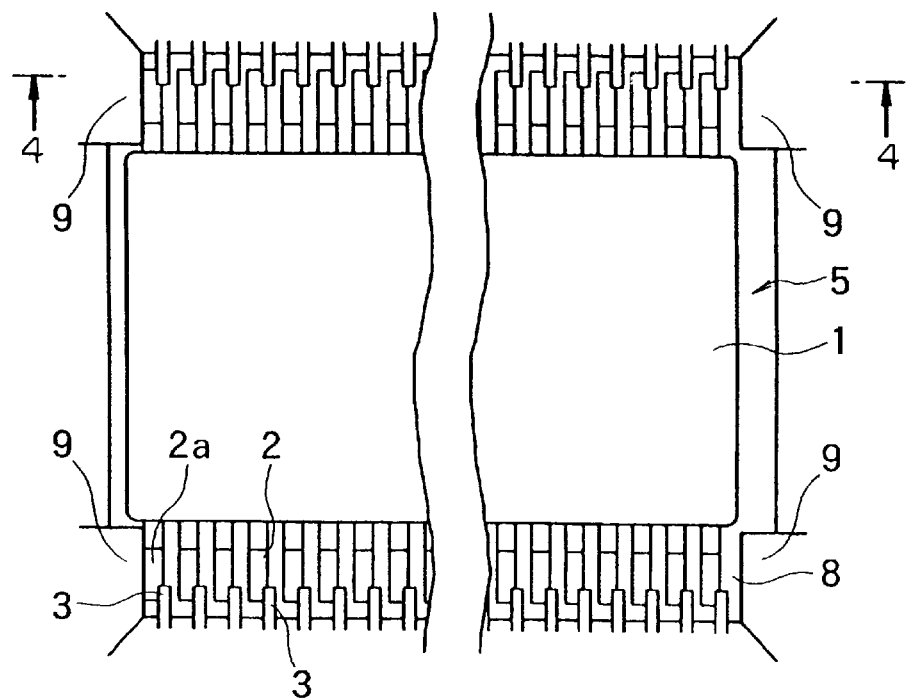
FIG. 3 is a plan view showing a conventional IC positioning construction.
Figure 4:
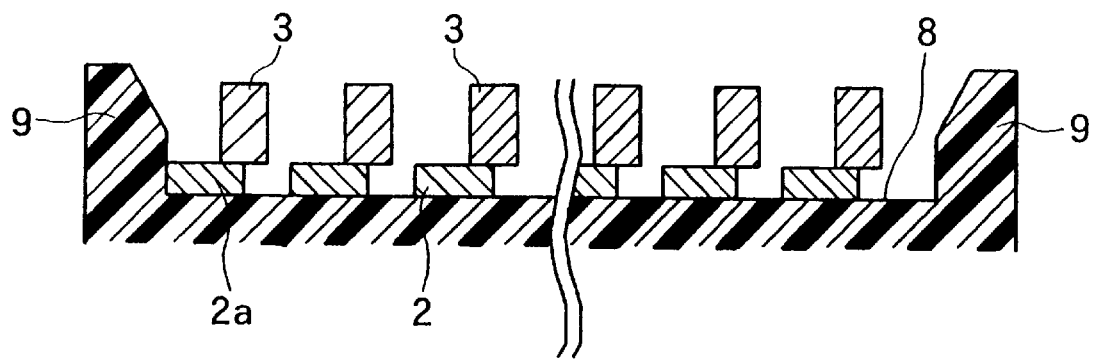
FIG. 4 is a sectional view taken on line 4—4 of FIG. 3.

FIGS. 5A through 9B show a representative example of an IC positioning device of the present invention, in which a pair of locators are applied to an IC socket of FIG. 2.

Figure 5A:
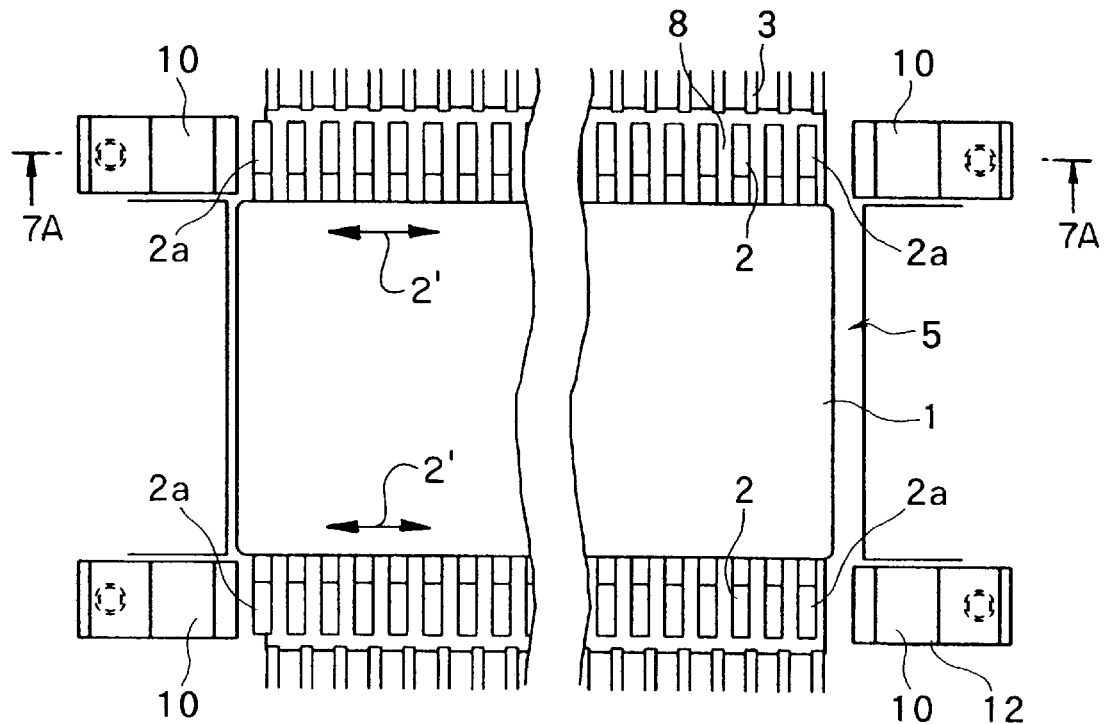
FIG. 5A is a plan view showing an IC positioning device according to one embodiment of the present invention before the IC leads are correctly positioned.
Figure 5B:
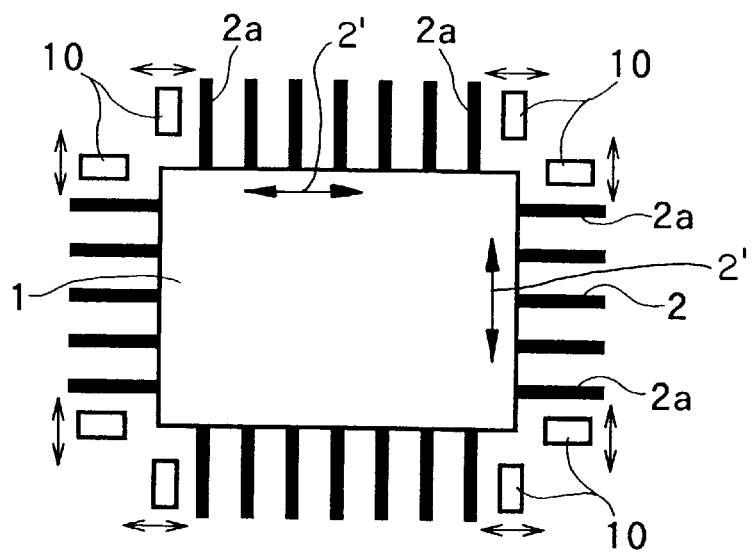
FIG. 5B is a plan view showing an arrangement of the positioning device with respect to an IC having leads projecting sideways from four sides thereof.

An IC is loaded in an IC receiving portion 5 which is formed in a center area of a socket body (or base) 4. Leads 2 arranged in array along opposite side surfaces of an IC body 1 and projecting sideways therefrom are supported on a seat surface 8. Each array of the leads 2 extends along an array direction 2' as shown in FIGS. 5A and 5B. Locators 10 are each arranged in the vicinity of outside locations of leads 2a which are located on extreme arraying ends of each lead array group.

As one preferred example, as shown in FIGS. 5, 5B, 6A and 6B, a pair of the locators 10 are arranged in opposing relation at outside locations of the leads 2a which are located on extreme arraying ends of each lead array group. That is, four of the locators 10 are arranged in the vicinity of the outside locations of the corner portions of the IC body 1 respectively.

Figure 7A:
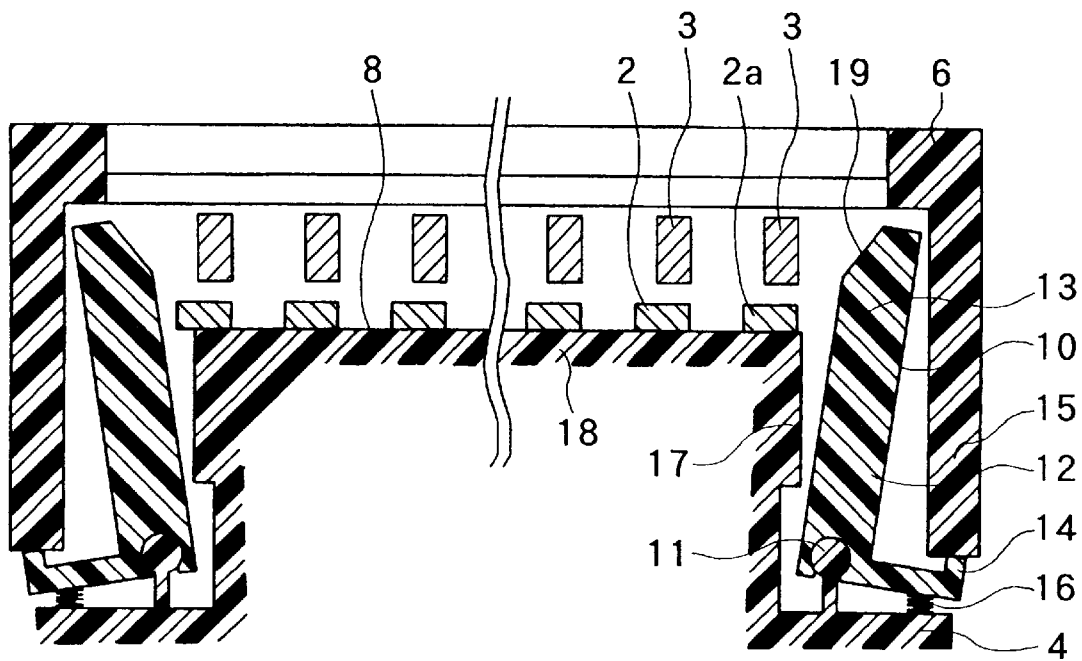
FIG. 7A is a sectional view taken on line 7A—7A of FIG. 5A.

FIG. 7A shows one example of the locator 10. In FIG. 7A, the locator 10 consists of a pressing lever 12 turnably attached to the socket body 4 through a pin 11. The pressing lever 12 includes a pressing portion 13 extending upwardly from its pivotal portion. The pressing lever 12 further includes a pressure receiving portion 14 extending sideways from the pivotal portion. Thus, each locator 10 is movably supported by the socket body (or base) 4 for movement toward and away from the IC receiving portion 5 respectively between a pressing position (as shown, for example, in FIG. 8A) and a releasing position (as shown, for example, in FIG. 7A).

On the other hand, a cover 6 overlies an upper part of the socket body 4 and serves as an actuator of the locator 10. This cover 6 includes a pressing portion 15 extending towards the pressure receiving portion 14. A pair of the pressing portions 15 are arranged in opposing relation so that when the cover 6 is depressed, the pressing portions 15 can push down the pressure receiving portions 14, respectively.

Each locator 10 is normally biased in a direction for pressing an outer surface of the lead 2a by a spring member 16. For example, the spring member 16 is arranged such that it urges the pressure receiving portion 14 upwardly in order to bias the pressing portion 13 in the direction for pressing the lead 2a.

The pressing lever 12 is restricted in turning amount in the pressing directon by a stopper 17 which abuts against a front surface of the pressing portion 13. The stopper 17 is formed, for example, at an outer side surface of an IC support platform 18 which forms a lead supporting seat surface 8. The pressing portion 13 extends upwardly along a side surface of the platform 18.

An inclined surface 19 is formed at an upper end of the pressing portion 13. This inclined surface 19 is adapted to guide an outer side surface of the lead 2a which is located on an extreme arraying end of the lead array group.

Figure 6A:
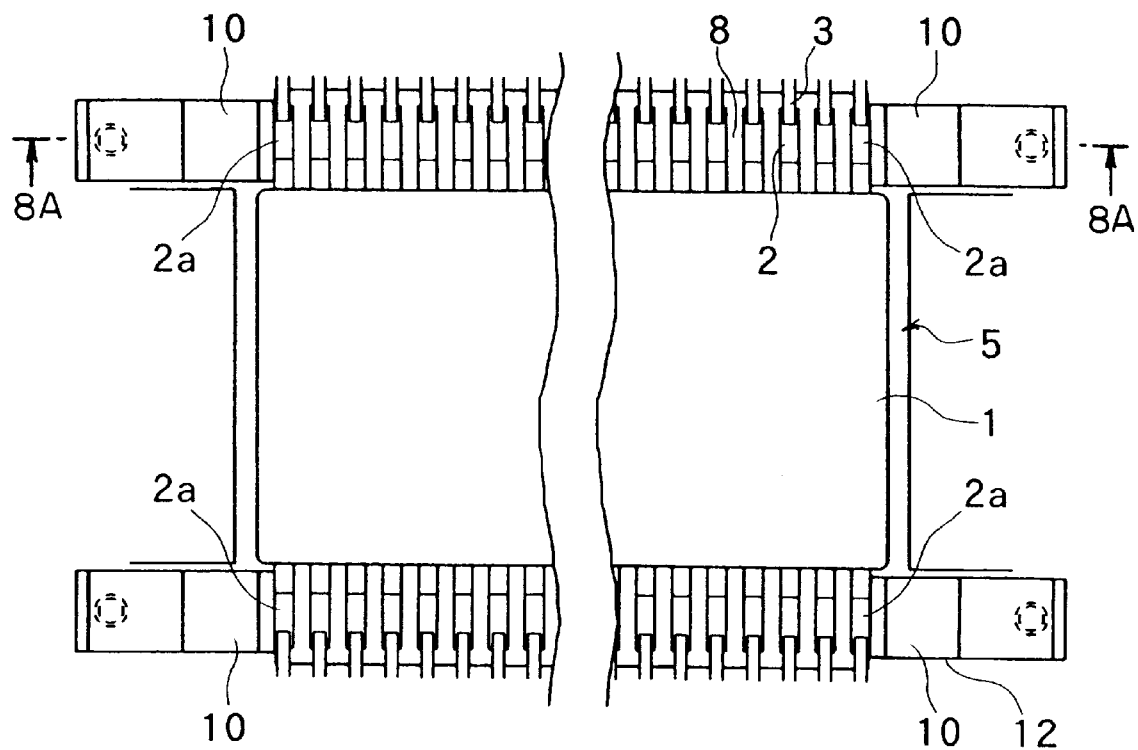
FIG. 6A is a plan view showing a state of physical connection between the leads and contacts after the leads are correctly positioned by the IC positioning device of FIG. 5.
Figure 6B:
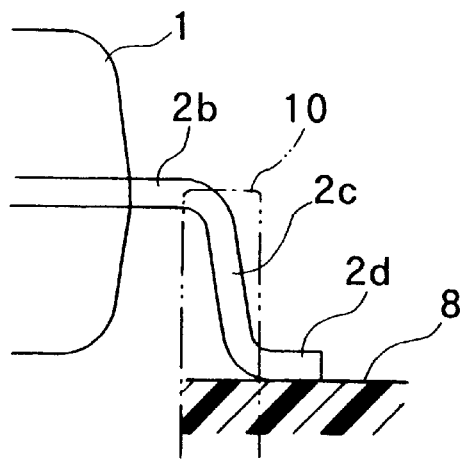
FIG. 6B is an enlarged side view showing one example of a pressing part of the IC positioning device with respect to a lead.

As shown in FIG. 6B, the locator is effective as a means for correctly positioning an IC which has gull-wing type leads 2. The leads 2 of this type each include a basal portion 2b slightly projecting sideways from an outer side surface of the IC body 1, an intermediate portion 2c bent downwardly from the basal portion 2b, and a distal end portion 2d bent sideways from a lower end of the intermediate portion 2c. Thus, the gull-wing type lead 2 has a so-called double bent configuration. From a view point of preventing deformation of the gull-wing type lead 2, the locator 10 preferably presses an outer surface of the intermediate portion 2c.

Figure 7B:
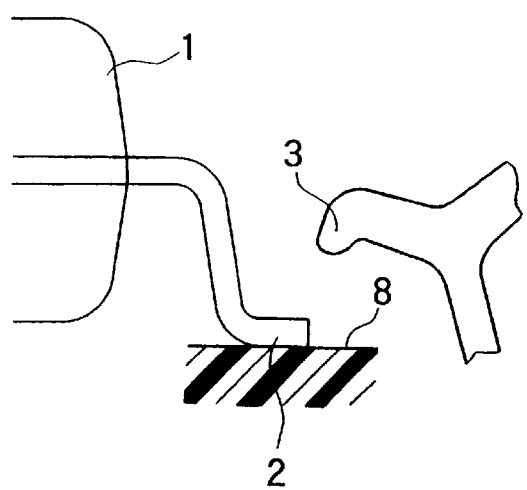
FIG. 7B is an enlarged side view showing a relation between a lead and a contact in that state.

When the cover 6 is depressed, as shown in FIGS. 7A and 7B, the contacts 3 are displaced backwardly into contact-releasing positions through the turnable levers 7 (FIG. 2). When the cover 6 is further depressed, the pressing portions 15 exert push-down forces upon to the pressure receiving portions 14 of the locators 10. As a consequence, the pressing levers 12 are turned to move the pressing portions 13 into the pressure-releasing positions. Thus, the cover 6 serves as an actuator.

Figure 8A:
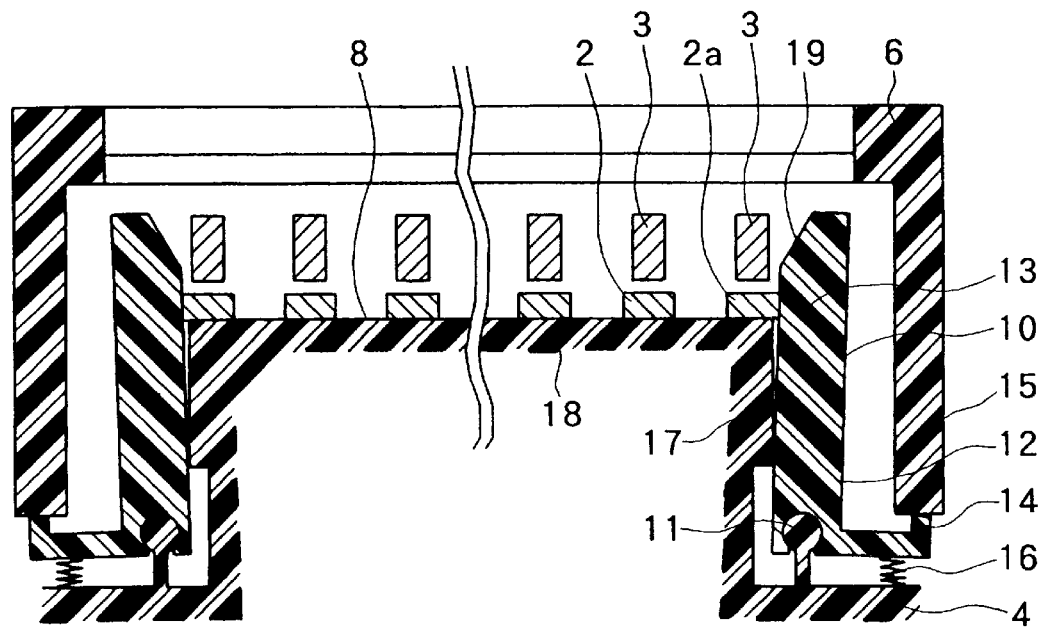
FIG. 8A is a sectional view taken on line 8A—8A of FIG. 6A, showing a state immediately before the contacts are brought into contact with the leads.
Figure 8B:
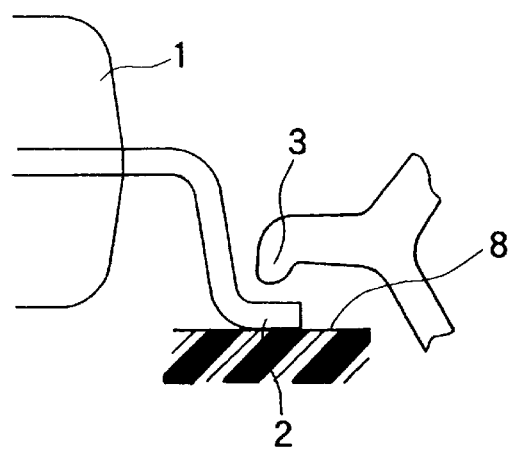
FIG. 8B is an enlarged side view showing a relation between a lead and a contact in that state.

In that state, the IC is loaded in the IC receiving portion 5 such that the leads 2 are supported on the seat surface 8, and then the depression of force against the cover 6 is removed. As a consequence, as shown in FIG. 8, the cover 6 is raised by the restoring force of the contacts 3 and the contacts 3 are displaced forwardly.

Also, the pressing levers 12 are turned forwardly (in the arraying direction of the lead array group) by the restoring force of the spring members 16 to raise the cover 6. The pressing lever 12 is turned further forwardly while exerting pressing force against the outer side surfaces of the leads 2a which are located on the extreme arraying ends. Following this movement, the array of leads 2 are moved as a unit along the seat surface 8, together with the IC body 1, thereby assuring correct contacting positions of the leads 2 relative to the contacts 3. Thus, as can be recognized by comparing, for example, FIGS. 7A and 8A, movement of each locator 10 from its releasing position (FIG. 7A) to its pressing position (FIG. 8A) causes the locator 10 to engage the endmost lead and thereby press an outer side surface of the endmost lead to move the array of leads and the IC body horizontally relative to the socket body (or base) 4 to the position shown, for example, in FIG. 8A.

When the locators 10 are arranged at opposite of each lead array, each locator 10 allows the IC to stand still at a location where the resilient pressing force of the spring members 16 is well balanced, thereby assuring the above-mentioned contacting positions.

Figure 9A:
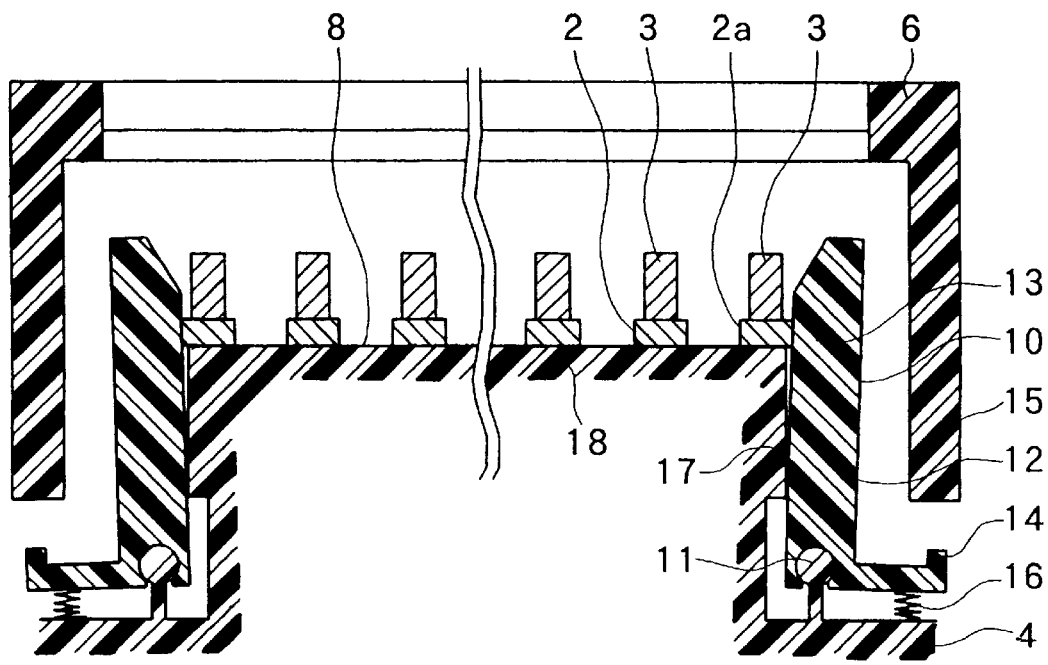
FIG. 9A is a sectional view similar to FIG. 8A but showing a state where the contacts are in contact with the leads.
Figure 9B:
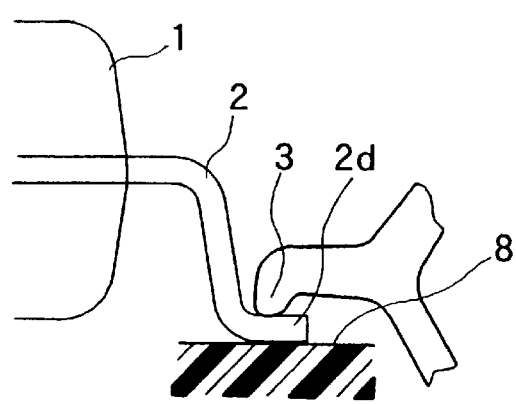
FIG. 9B is an enlarged side view showing a relation between a lead and a contact in that state.

When correct positions of the leads 2 are obtained, as shown in FIG. 9, the contact 3 is brought into contact with upper surfaces of the distal end portion 2d of the lead 2 under pressure. From a view point of accuracy of positioning, the locator 10 may be arranged such that the locator 10 can press the side surface of the distal end portion 2d of the lead 2a with which the contact 3 is brought into contact.

The present invention includes a case where the locator which presses in one direction (see FIG. 5A and 5B) is a ruler restricting wall, and only a locator for pressing in the other direction is employed, so that only the outer side surface of the lead which is located on one end of the lead array is pressed by the locator and the outer surface of the lead which is located on the other end of the lead array is urged against the stationary restricting wall.

The locator 10 is turned in the arraying direction of the lead array group and presses an adequate part of the outer side surface of the lead 2a.

Figure 10:
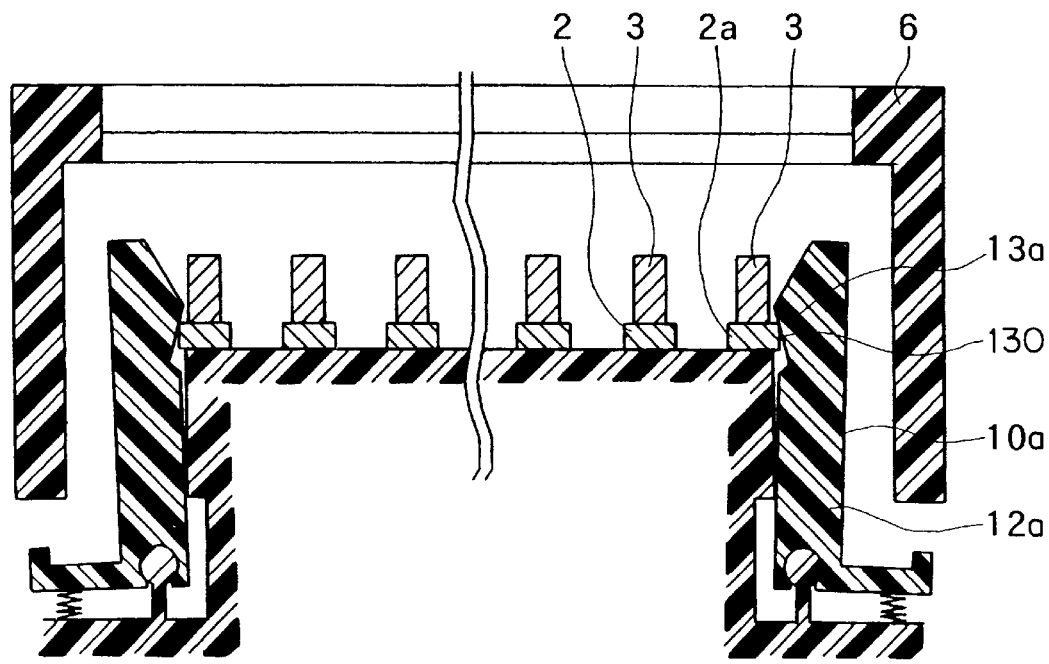
FIG. 10 is a sectional view of a socket, showing an IC positioning device in which a press lever serving as a locator presses the leads with a sideward force and a downward force.

As shown in FIG. 10, the locator 10a consisting of the pressing lever 12a can be constructed such that the pressing portion 13a shown in FIG. 10, presses the outer surface of the distal end portion 2d or an upper edge portion of the outer surface of the basal portion 2b of the lead 2a, so that pressing force in the arraying direction of the lead array group is generated while exerting a downward pressing force against lead. When the pressing surface of the pressing portion 13a is defined by an inclined surface 130, the downward compound force can favorably be obtained. As a consequence, the IC can be biased downwardly by this downward compound force.

Timing is properly set such that the locator 10a presses the lead 2a before the contact 3 is brought into contact with the lead 2 under pressure.

In other words, after the lead 2a is pressed by the locator 10a into the position, the contacts 3 are brought into contact with the upper surfaces of the leads 2 under pressure.

Figure 11:
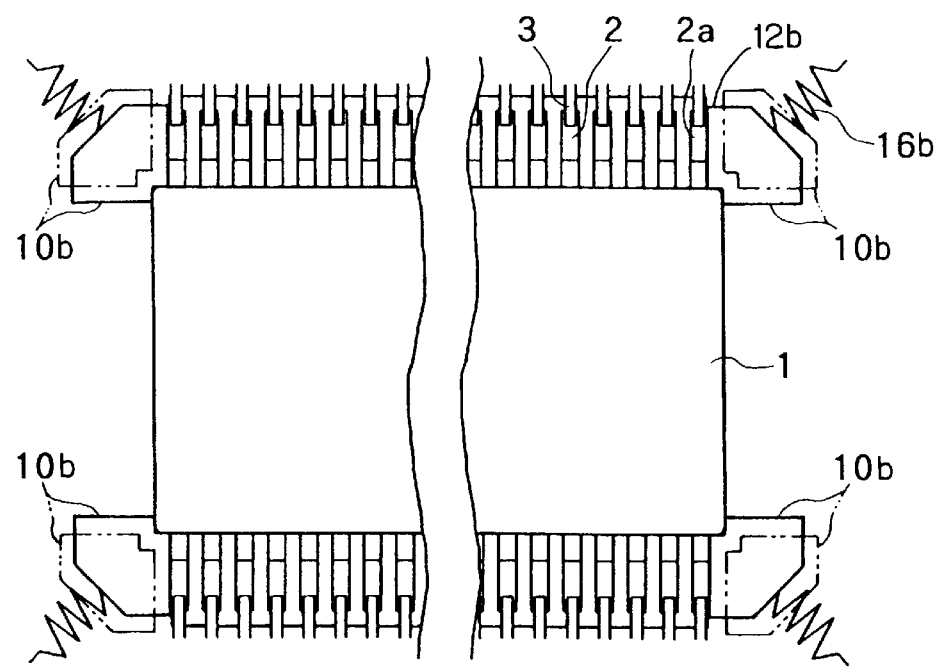
FIG. 11 is a plan view of the socket, showing the positioning device in which the locator moves diagonally with respect to an arraying direction of the leads.

In the example shown in FIG. 11, the locators 10b are arranged such that they presses the outer surfaces of the leads 2a obliquely with respect to the arraying direction of the lead array group. These locators 10b are arranged in opposing relation at the corner portions of the IC body 1 and are caused to obliquely press-the outer surfaces of the leads 2a which are located on the extreme ends of the lead array, by the spring members 16b while moving towards the corner portions of the IC body 1.

As a consequence, the leads 2 and the IC body 1 are caused to move in the arraying direction of the lead array group, thereby ensuring contacting positions of the leads 2 with respect to the contacts.

At that time, as shown in FIG. 11, each locator 10b is provided with an IC body pressing portion and an IC lead 2a pressing portion, so that the locator 10b can press the two or one side forming an angle of the IC body 1 and the outer surface of the lead 2a.

In the case of an IC in which the IC leads 2 project from four sides of the IC body 1, eight locators can be employed so that they can press the leads on the extreme ends of each lead array group as shown in FIG. 5B. In the embodiment shown in FIG. 11, each of the locators 10b can press the outer surfaces of the leads which are located on the extreme ends of the two lead array groups respectively projecting from the two adjacent sides (i.e. which form a corner portion of the IC body 1).

The above locators are arranged in opposing relation on a single diagonal line of the IC body 1 or on two diagonal lines of the IC body 1.

Figure 12:
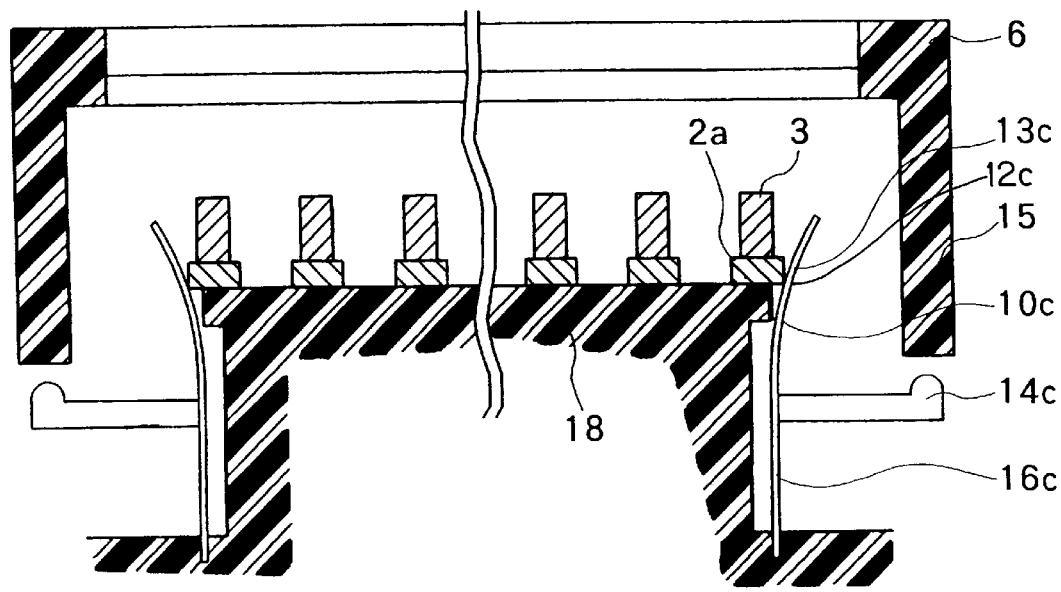

In FIG. 12, the pressing portion 13c of each locator 10c is formed of a resilient member represented by a leaf spring. This pressing portion presses the outer surface of the IC lead 2a in the arraying direction by its own resiliency.

The locator 10c can thus be resiliently supported by the spring member 16c, or the locator 10c can be provided with the resilient pressing portion 130 as mentioned, so that it resiliently presses the outer surface of the lead 2a, thus allowing for absorption of the manufacturing tolerance of the lead 2 so that the lead will not be deformed by pressing force overly applied to the outer surface of the lead 2a.

As shown in FIG. 12, the locator 10c formed of the leaf spring is secured at its lower end to the socket body 4 and extends upwardly from the socket body 4 along the side surface of the IC support platform 18. An upper end of the locator 10c is defined by the lead pressing portion 13c.

Also, the leaf spring is provided with a pressure receiving portion 14c projecting backwardly from an intermediate portion of the leaf spring. When the cover 6 is depressed, the pressure receiving portion 14c of the leaf spring is pushed down by the pressing portion 15 of the cover 6. As a result, the leaf spring is bent backwardly against its resiliency serving its fixed lower end as a fulcrum and resiliently displaced into a pressing force releasing position. On the contrary, the leaf spring is restored into a forward pressing position by its own resiliency and resiliently presses the outer surface of the lead 2a.

Figure 13:
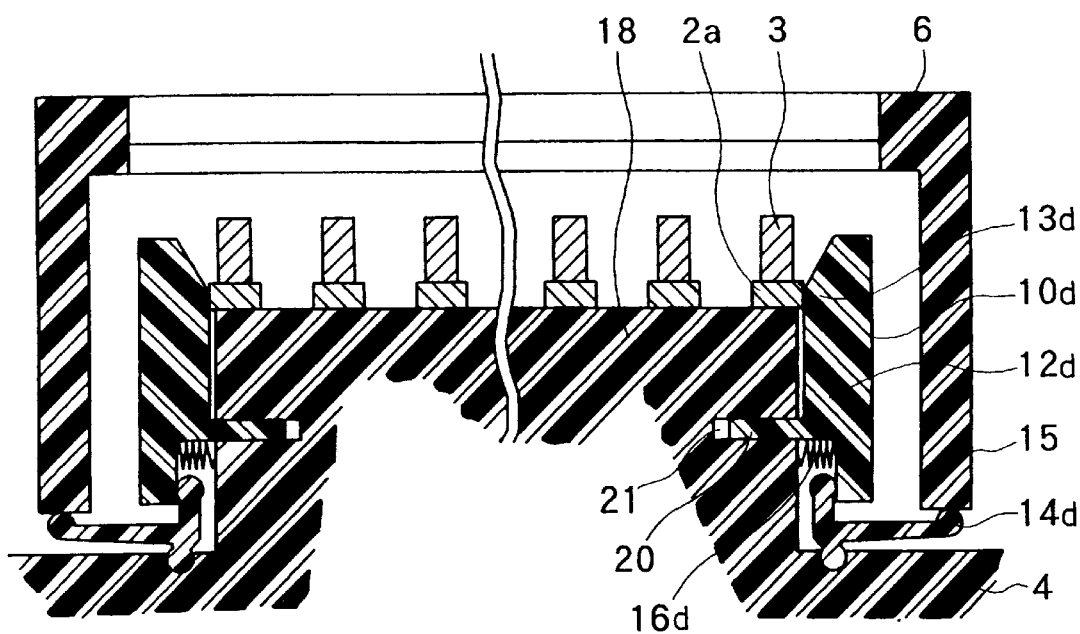
FIG. 13 is a sectional view of the socket, showing the positioning device in which the press lever serving as a locator linearly reciprocally moves.

FIGS. 7 through 10 show examples in which the pressing levers 12 constituting the locators 10 are tumably disposed to press the leads in the arraying direction of the lead array group, whereas FIG. 13 shows an example in which the pressing levers 12d are linearly reciprocally movably disposed in the arraying direction of the lead array group.

In FIG. 13, there is employed means for guiding the above-mentioned linear reciprocal movement. As such means, each pressing lever 12 is provided with a slide portion 20 which is laterally slidable with respect to the socket body 4.

As shown for example in FIG. 13, the slide portion 20 extends inwardly from the pressing lever 12d and is laterally slidably fitted into a guide groove 21 formed laterally in a side surface of the IC support platform 18. With this arrangement of a guide, the pressing lever 12d is linearly reciprocally moved.

Also, in the example of FIG. 13, the pressure receiving portion 14d and the pressing portion 13d are formed of levers as separate parts. The lever forming the pressure receiving portion 14d is turnably axially supported by the socket body 4 such that the pressing portion 15 of the cover 6 can act on the external end of the lever and an inner end of the lever can engage the lever as the pressing portion 13d. When the pressure receiving portion 14d is turned, the engaging portion thereof the pressing portion 13d backwardly to cause it to retreat linearly backwardly. Also, the pressing portion 13d is biased forwardly by the spring member 16d and linearly advanced to the lead pressing position.

In the arrangement of FIG. 13, the pressing lever 12d can be linearly reciprocally moved obliquely in the arraying direction of the lead array group or it can alternatively be moved obliquely towards the comer of the IC body 4, in order to press the outer surface of the lead 2a or the outer surface of the lead and the side surface of the comer portion of the IC body 4 so that the leads are correctly positioned. FIG. 13 merely illustrates one concrete example of such an idea.

The locator presses the outer surface of the lead which is located on the extreme end of an array of the IC leads which are positionally displaced, or the outer surface of the lead and the side surface of the IC body, so that the IC leads are correctly positioned relative to the contacts.

It is to be understood that the form of the invention herewith shown and described is to be taken as the preferred embodiment of the same, and that various changes in the shape, size and arrangement of parts may be resorted to without departing from the spirit of the invention or the scope of the subjoined claims.

What is claimed is:

1. An IC positioning device for use in positioning an IC having a first array of leads extending along a first side surface of an IC body and having a second array of leads extending along a second side surface of the IC body, the first array of leads being aligned along a first horizontal array line, and the second array of leads being aligned along a second horizontal array line, said IC positioning device comprising:

a base having a support portion defining an IC receiving portion; and a first locator movably supported by said base, said first locator including a pressing portion such that said pressing portion of said first locator is movable in first and second opposing directions along said first horizontal array line respectively between a first pressing position and a first releasing position, said pressing portion of said first locator presses generally in said first direction against an outer side surface of a first endmost lead of the first array of leads when said pressing portion of said first locator is in said first pressing position, and said pressing portion of said first locator is spaced away from said first pressing position generally in said second direction along said first horizontal array line when said pressing portion of said first locator is in said first releasing position, such that when said locator is engaged against the first endmost lead and is moved toward said first pressing position from said first releasing position, the first array of leads and the IC body are moved horizontally relative to said base to a predetermined position, whereby the first array of leads and the IC body are placed in a corrected position.

2. An IC positioning device according to claim 1, further comprising a spring biasing said locator toward said first pressing position.

3. An IC positioning device according to claim 2, wherein said first locator includes a lead pressing portion, and said lead pressing portion comprises a resilient member.

4. An IC positioning device according to claim 2, further comprising an actuator for moving said first locator from said first pressing position to said first releasing position.

5. An IC positioning device according to claim 1, further comprising a second locator movably supported by said base, said second locator including a pressing portion such that said pressing portion of said second locator is movable in said second and first opposing directions along said first horizontal array line respectively between a second pressing position and a second releasing position, said pressing portion of said second locator presses generally in said second direction against an outer side surface of a second endmost lead of the first array of leads when said pressing portion of said second locator is in said second pressing position, and said pressing portion of said second locator is spaced away from said second pressing position generally in said first direction along said first horizontal array line when said pressing portion of said second locator is in said second releasing position, such that when said locator is engaged against the second endmost lead and is moved toward said pressing position from said releasing position, the first array of leads and the IC body are moved horizontally relative to said base to the predetermined position.

6. An IC positioning device according to claim 5, further comprising springs biasing said locators toward said first and second pressing positions, respectively.

7. An IC positioning device according to claim 5, further comprising an actuator for moving said first and second locators from said first and second pressing positions to said first and second releasing positions, respectively.

8. An IC positioning device according to claim 5, wherein each of said first and second locators includes a lead pressing portion, and said lead pressing portion of each of said first and second locators comprises a resilient member.

9. An IC positioning device according to claim 5, wherein said first locator is operable to press against both the side surface of the first endmost lead of the first array of leads and a side surface of the IC body; and said second locator is operable to press against both the side surface of the second endmost lead of the first array of leads and a side surface of the IC body.

10. An IC positioning device according to claim 1, wherein said first locator includes a lead pressing portion, and said lead pressing portion comprises a resilient member.

11. An IC positioning device according to claim 10, further comprising an actuator for moving said first locator from said first pressing position to said first releasing position.

12. An IC positioning device according to claim 1, wherein said first locator is operable to press against both the side surface of the first endmost lead of the first array of leads and a side surface of the IC body.

13. An IC positioning device according to claim 12, further comprising an actuator for moving said first locator from said first pressing position to said first releasing position.

14. An IC positioning device according to claim 1, wherein said pressing portion of said first locator is movably mounted to said base, and said first locator further comprises a pressure receiving portion projecting from said pressing portion in said second direction.

15. An IC positioning device according to claim 14, further comprising a spring operably interposed between said base and said pressure receiving portion and biasing said locator toward said first pressing position.

16. An IC positioning device according to claim 15, further comprising an actuator movable relative to said base in a generally vertical direction, said actuator being engaged with said pressure receiving portion such that, upon downward movement of said actuator, said pressure receiving portion is pressed downwardly and said locator is moved toward said first releasing position.

17. An IC positioning device according to claim 14, further comprising a spring operably interposed between said base and said pressing portion and biasing said locator toward said first pressing position.

18. An IC positioning device according to claim 17, wherein said pressure receiving portion and said pressing portion are separate elements movable relative to one another.

19. An IC positioning device according to claim 18, wherein said pressing portion is slidably mounted to said base, and said pressure receiving portion is pivotally mounted to said base, a first end of said pressure receiving portion engaging said pressing portion.

20. An IC positioning device according to claim 1, further comprising a first array of contacts, each of said contacts having a base portion fixed to said base, and a contact portion having a resiliency so as to be resiliently movable from a lead contacting position to a lead non-contacting position spaced away from said lead contacting position; and a first spring resiliently biasing said first locator toward said first pressing position, said first spring having a resiliency independent of said resiliency of said contact portions of said contacts of said first array of contacts.

21. An IC positioning device for use in positioning an IC having an array of leads extending in an array direction along a first side surface of an IC body, the array of leads being aligned along a horizontal array line, said IC positioning device comprising:

a base having a support portion defining an IC receiving portion for receiving the IC in a generally horizontal posture;

a locator pivotally mounted to said base, said locator including a pressing portion such that said locator is pivotal in first and second opposing directions along the horizontal array line respectively between a pressing position and a releasing position, said pressing portion of said locator presses generally in said first direction against an outer side surface of a first endmost lead of the array of leads when said pressing portion of said locator is in said pressing position, and said pressing portion of said locator is spaced away from said pressing position generally in said second direction along the horizontal array line when said pressing portion of said locator is in said releasing position, said locator being mounted at a side of said IC receiving portion;

wherein said pressing portion of said locator extends generally vertically for pressing the first endmost lead of the array of leads in the array direction toward said IC receiving portion, and said locator further comprises a pressure receiving portion extending generally horizontally away from said pressing portion in a direction so as to project away from the array of leads; and wherein a spring is interposed between said locator and said base and biases said pressing portion toward said IC receiving portion into said pressing position.

22. An IC positioning device according to claim 21, further comprising an actuator movably mounted relative to said base for movement in a generally vertical direction, said actuator being engaged with said pressure receiving portion of said locator.

23. An IC positioning device according to claim 22, wherein said base constitutes a base of an IC socket, and said actuator constitutes a cover of an IC socket.

* * * * *